(12) United States Patent
Suemitsu et al.

(10) Patent No.: US 7,840,228 B2
(45) Date of Patent: Nov. 23, 2010

(54) INTER-BASE STATION SYNCHRONIZATION SYSTEM, SYNCHRONIZATION CONTROL DEVICE, AND BASE STATION

(75) Inventors: Taisei Suemitsu, Tokyo (JP); Kuniyuki Suzuki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 634 days.

(21) Appl. No.: 11/815,045

(22) PCT Filed: Feb. 1, 2005

(86) PCT No.: PCT/JP2005/001415

§ 371 (c)(1),
(2), (4) Date: Jul. 30, 2007

(87) PCT Pub. No.: WO2006/082628

PCT Pub. Date: Aug. 10, 2006

(65) Prior Publication Data

US 2008/0152059 A1 Jun. 26, 2008

(51) Int. Cl.
*H04B 7/00* (2006.01)
*H04B 15/00* (2006.01)
(52) U.S. Cl. ............. 455/502; 455/67.11; 455/67.16; 370/350; 370/503
(58) Field of Classification Search ............ 370/503, 370/329, 330, 350, 208, 215; 455/502, 503, 455/422.1, 436, 67.11, 67.16, 68, 703, 71
See application file for complete search history.

(56) References Cited

U.S. PATENT DOCUMENTS 5,734,985 A * 3/1998 Ito et al. ............... 455/503
6,788,947 B2 * 9/2004 Becker et al. ............ 455/502

(Continued)

FOREIGN PATENT DOCUMENTS

CN 1365554 A 8/2002

(Continued)

OTHER PUBLICATIONS

3GPP TS 25.401 V3.10.0, "$3^{rd}$ Generation Partnership Project; Technical Specification Group Radio Access Network; Utran Overall Description (Release 1999)", Technical Specification, pp. 1-38, 2002.

(Continued)

*Primary Examiner*—Sujatha Sharma
(74) *Attorney, Agent, or Firm*—Oblon, Spivak, McClelland, Maier & Neustadt, L.L.P.

(57) ABSTRACT

A base station synchronization system, a synchronization controller, and a base station are provided that are capable of establishing precise synchronization among a plurality of base stations. In a base station synchronization system including a plurality of base stations and a base station concentrator, the base station concentrator includes a control information generator for generating synchronization control information, and each base station includes a VCO oscillating at a frequency corresponding to an input control voltage, and a corrector for correcting the input control voltage to the VCO according to the synchronization control information. This configuration makes it possible to establish synchronization among the master clocks of the plurality of base stations so as to suppress phase differences among the base stations and precisely synchronize the base stations with each other.

19 Claims, 14 Drawing Sheets

U.S. PATENT DOCUMENTS

| | | |
|---|---|---|
| 7,106,709 B2 * | 9/2006 | Davidsson et al. .......... 370/330 |
| 7,643,566 B2 * | 1/2010 | Hwang et al. ................ 375/260 |
| 2002/0054611 A1 * | 5/2002 | Seta ........................... 370/503 |
| 2006/0126554 A1 | 6/2006 | Motegi et al. |

FOREIGN PATENT DOCUMENTS

| | | |
|---|---|---|
| CN | 1505279 A | 6/2004 |
| EP | 1 199 838 A1 | 4/2002 |
| JP | 7 250392 | 9/1995 |
| JP | 10-13949 | 1/1998 |
| JP | 2998781 | 11/1999 |
| JP | 2000-174742 | 6/2000 |
| JP | 2000350245 | * 12/2000 |
| JP | 2002 94441 | 3/2002 |
| JP | 2002-94606 | 3/2002 |
| WO | 01 93492 | 12/2001 |
| WO | WO 2004/047474 A1 | 6/2004 |

OTHER PUBLICATIONS

Chinese Official Action for Application No. 2005800476214 issued on Jul. 19, 2010 with English translation.

* cited by examiner

FIG. 5
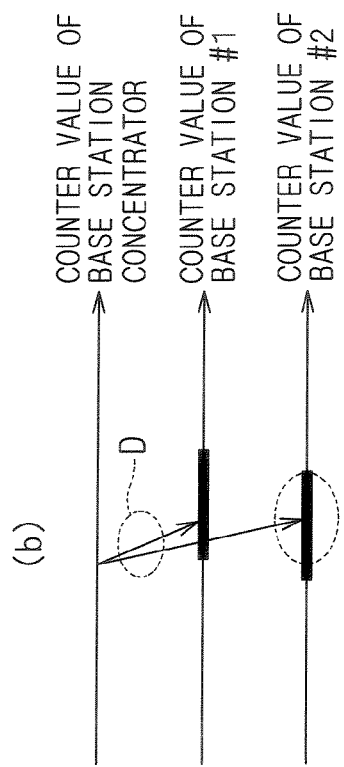
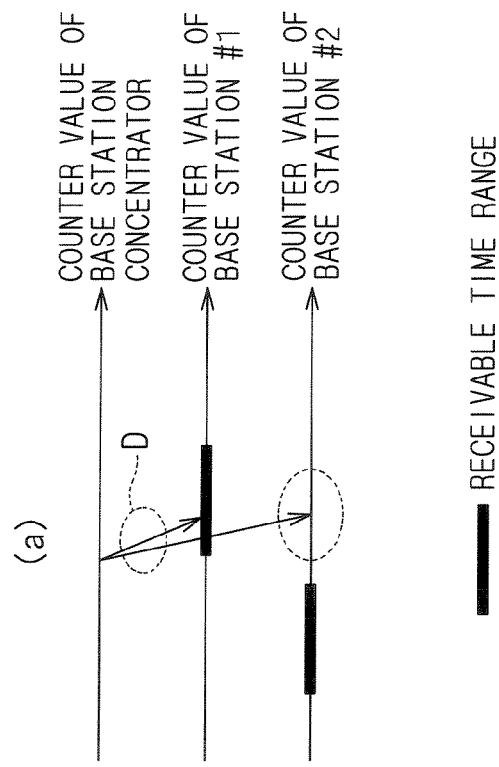
▬ RECEIVABLE TIME RANGE

INTER-BASE STATION SYNCHRONIZATION SYSTEM, SYNCHRONIZATION CONTROL DEVICE, AND BASE STATION

TECHNICAL FIELD

The present invention relates to a base station that performs radio communication with mobile communications terminals, a synchronization controller that provides control to establish synchronization among a plurality of base stations, and a base station synchronization system including them.

BACKGROUND ART

Conventional mobile communications scheme like the W-CDMA (wideband-Code Division Multiple Access) defined by 3GPP (3rd Generation Partnership Project) only standardize implementations in which base stations (called NodeB in 3GPP) are directly connected to a base station controller (called RNC (radio Network Controller) in 3GPP) (See Non-patent Document 1).

Also, in general, considering the configuration of the base station controller, the number of base stations already used in service change software, or change hardware by providing additional memory, for example.

In contrast to the 3GPP, in connections between mobile communications networks such as PHS (personal Handyphone System) and public networks, there are techniques that use base station concentrators as higher-level devices that supervise the base stations. When such a base station concentrator is connected to a plurality of base stations to make connections with the base stations and public network, the base station concentrator supplies a frame synchronization signal to the base stations so that frame synchronization can be established among the plurality of base stations on the basis of the frame synchronization signal from the base station concentrator. (For example, see Patent Document 1.)

Non-patent Document 1: 3GPP TS (Technical Specification) 25.401 V3.10.0, 2002-06, retrieved from the Internet [retrieved on 2005-01-24]: <URL: http://www.3gpp.org/ftp/Specs/latest/R1999/25_series/25401-3a0.zip>.

Patent Document 1: Japanese Patent Application Laid-Open No. 2002-094441

Patent Document 2: Japanese Patent Application Laid-Open No. 08-237731 (1996)

DISCLOSURE OF THE INVENTION

Problems to be Solved by the Invention

For example, with a base station controller standardized by 3GPP, the number of connected base stations cannot be increased even when base stations with smaller user accommodating capacities are connected in place of base stations with larger user accommodating capacities, and then the total number of accommodated users is reduced when such a base station controller is used. Then, the number of users accommodated in the system is reduced when base stations with smaller user accommodating capacities are provided in shadow areas where radio communication is difficult.

In order to solve this problem, a technique is possible in which a base station concentrator for supervising a plurality of base stations is used to make the base station controller recognize the plurality of base stations as a single base station. In such a technique, it is essential to match the timing among the base stations connected to the base station concentrator so that, for example, soft handover can be implemented.

However, in the conventional configuration in which the base station concentrator supplies frame synchronization signal to the base stations, the free-running counter values of the base stations may present discontinuous values due to deviations in phase of the master clocks. Here, the free-running counter values are values outputted from the free-running counters provided in the base stations to supply counter values to individual functional parts within the base stations.

In particular, in CDMA, the number of operating phenomena increases and the amount of verification works in base stations increases depending on the time positions of lost counter values and the amounts of increase/decrease of counter values. More specifically, for example, evaluations have to be made to see whether the circuit is set such that the free-running counter in a lower-level first base station connected to the base station concentrator loads the initial value of spreading code of the modulator and demodulator, or whether the timing margin is sufficient when a process that waits for the free-running counter of the first base station is shorter than expected.

Especially, in the case of CDMA base stations in which a plurality of users have to perform parallel operations according to various timings by the FDD (Frequency Division Duplex), the number of such verification works exponentially increases ((all cases requiring timing verifications)^(the number of users)). Also, in Compressed-Mode of 3GPP or in process like broadcast channels that operate in extremely long cycles, just an instantaneous timing loss might render the entire system operations abnormal for a long time even if the unlikely event of a timing abnormality, because normalization operations are usually kept on standby until the next cycle.

Also, when the wire transmission line between the base station concentrator and base stations is an ATM (Asynchronous Transfer Mode) or IP (Internet Protocol) circuit other than a dedicated line, it is impossible to directly transmit clocks at hubs, routers and the like, and then circuit synchronization cannot be established in the base stations. Accordingly, propagation delays and drifts between the base station concentrator and a base station will be considerably different from propagation delays and drifts between the base station concentrator and another base station.

Under these circumstances, in conventional systems, radio frame timing differences among a plurality of base stations become larger and larger as time passes, no matter how precise the clock source may be, and then data sent from the base station controller will arrive at a base station too early and another base station too late, making normal communication impossible.

An object of the present invention is to provide a base station synchronization system, a synchronization controller, and a base station which are capable of establishing precise synchronization among a plurality of base stations.

Means for Solving the Problems

According to the present invention, a base station synchronization system includes a plurality of base stations and a synchronization controller that provides control to establish synchronization among the plurality of base stations, wherein said synchronization controller includes a control information generator that generates synchronization control information for synchronizing master clocks of said plurality of base stations with each other, and each said base station includes a master clock generator that oscillates at a frequency corresponding to an input control voltage, and a control voltage corrector that corrects the input control voltage to said master clock generator in accordance with the synchronization control information generated by said synchronization controller.

The present invention also provides a synchronization controller that provides control to establish synchronization among a plurality of base stations, and the synchronization controller includes a control information generator that generates control information for synchronizing master clocks of said plurality of base stations with each other.

The present invention also provides a base stations that synchronizes with another base station, and the base station includes a master clock generator that oscillates at a frequency corresponding to an input control voltage, and a control voltage corrector that corrects the input control voltage to said master clock generator in accordance with synchronization control information that is provided from outside.

EFFECTS OF THE INVENTION

According to the present invention, the master clocks of the plurality of base stations are synchronized with each other, which makes it possible to suppress phase differences among the base stations to precisely synchronize the base stations with each other.

BEST MODE FOR CARRYING OUT THE INVENTION

First Preferred Embodiment

FIG. 1 is a diagram illustrating a network configuration according to a first preferred embodiment of the present invention. This network includes a base station controller 11, a plurality of base stations 13, and a base station concentrator 12 connected between them. The base station controller 11 and the base stations 13 are W-CDMA equipment defined by 3GPP, for example, and the base stations 13 are devices that perform radio communication with mobile communications terminals (not shown), and the base station controller 11 is a device of a higher level that is connected to the plurality of base stations 13. The base station concentrator 12 is connected with the plurality of base stations 13 of a lower level, e.g., through an IP (Internet Protocol) network, for the purpose of, e.g., making the higher-level base station controller 11 recognize all base stations 13 connected thereto as a single base station 13.

In this configuration, the base station concentrator 12 and the plurality of base stations 13 connected thereto constitute the base station synchronization system of the invention.

The base station concentrator 12 includes a VCO (Voltage-Controlled Oscillator) 20 and a control information generator 21. The VCO 20 is built in the base station concentrator 12 to generate a master clock. The control information generator 21 generates synchronization control information according to phase information about a master clock generated in each base station 13 (counter values based on the master clock). Here, a comparison is made with phase information about the master clock generated in the base station concentrator 12 (counter values based on the master clock), a frequency deviation (a difference between counter values) is calculated as synchronization control information corresponding to the result of the comparison, and a control voltage corresponding to the frequency deviation is generated as the synchronization control information. The oscillator in the base station concentrator 12 may be, e.g., and OCXO (Oven-Controlled Crystal Oscillator), in place of the VCO 20, when voltage control is not required.

Each base station 13 has a VCO 30. The VCO is built in the base station 13 to generate the master clock.

Next, the operation illustrated in FIG. 1 will be described.

Each base station 13 informs the base station concentrator 12 of free-running counter values (time stamps), as the phase information, generated on the basis of the master clock oscillated by the VCO 30. In W-CDMA applications, the free-running counter values may be BFN (NodeB Frame Number). The base station concentrator 12 compares the phase information about the master clock in the base station 13 (counter values based on the master clock) and the phase information about the master clock in the base station concentrator 12 (counter values based on the master clock), and informs the base station 13 of the difference as the synchronization control information. The, according to the synchronization control information, the base station 13 corrects the control voltage inputted to the VCO 30. The series of operations are performed for all combinations of the base stations 13 (#1 to #n) and the base station concentrator 12.

FIG. 2 is a diagram illustrating the detailed configurations of the base station concentrator and a base station. The base station concentration 12 further includes a free-running counter 22 and a phase comparator 23, in addition to the VCO 20 and the control information generator 21. The free-running counter 22 is a counter that is run by the VCO 20. The phase comparator 23 includes subtracters 24, 25, a multiplier 26, and an integrator 27, so as to compare counter values (phase information) provided by the free-running counter 22 in the base station concentrator 12 and counter values (phase information) provided by a free-running counter 31 of the base station 13. The subtracter 24 subtracts the counter value of the free-running counter 22 of the base station concentrator 12 from the counter value of the free-running counter 31 of the base station 13. The subtracter 25 subtracts the output value of the integrator 27 from the difference between the counter values obtained by the subtracter 24. The multiplier 26 multiplies together the output value form the subtracter 25 and a time constant $\alpha$ ($0<\alpha<1$). The integrator 27 continuously adds the output values from the subtracter 25 multiplied by the time constant $\alpha$. The subtracter 25, multiplier 26, and integrator 27 constitute a loop circuit for averaging of the counter values. The control information generator 21 stores a table indicating a relation between the frequency deviation and control voltage, and it generates a control voltage corresponding to the frequency deviation as the result of comparison made by the phase comparator 23, and informs the bas station of the control voltage as the synchronization control information. The resultant value obtained by averaging the differences between outputs of the free-running counter 22 of the base station concentrator 12 and outputs of the free-running counter 31 of the base station 13 corresponds to an average of differences between the base oscillation frequencies of the base station concentrator 12 and the base station 13. The time for averaging the differences between counter values (a period for averaging) can be changed according to the time constant $\alpha$ set for the multiplier 26. Experiential values obtained by experiments are stored as the relation between the count value differences and control voltage values.

Each base station 13 has the free-running counter 31, a DC power supply 32, and a corrector 33, in addition to the VCO 30. The free-running counter 31 is run by the VCO 30 of the base station 13. The DI power supply 32 supplies a control voltage to the VCO 30. The corrector 33 corrects the control voltage supplied to the VCO 30 according to the synchronization control information provided from the base station concentrator 12.

Next, the operation illustrated in FIG. 2 will be described.

Count values by the free-running counter 31 of the base station 13 are reported to the base station concentrator 12 from the base station 13 (at proper times without delay). In the base station concentrator 12, the subtracter 24 subtracts the count value of the free-running counter 22 from the count value reported from the base station 13. Next, the subtracter 25 subtracts the value outputted from the integrator 27 from the count value difference obtained by the subtracter 24. The multiplier 26 multiplies together the value obtained by the subtracter 25 and the time constant $\alpha$. The frequency deviation between the master clocks of the base station concentrator 12 and the base station 13 is calculated in a longer cycle as the value $1/\alpha$ is larger (as the value $\alpha$ is smaller). Larger values of $1/\alpha$ are suitable for applications that extract stable oscillation frequency differences in longer cycles. The results of multiplication by the multiplier 26 are inputted to the integrator 27, and the input values are continuously added. The result of addition in the integrator 27 is inputted to the subtracter 25 and to the control information generator 21.

In the control information generator 21, the average value of differences between the count values of the base station concentrator 12 and the base station 13 is converted to a control voltage according to the table storing the relation between count value difference and control voltage. The information indicating the control voltage is reported to the base station 13 as the synchronization control information.

The synchronization control information sent to the base station 13 is inputted to the corrector 33 of the base station 13. The corrector 33 then corrects the control voltage outputted from the DC power supply 32 on the basis of the synchronization control information (control voltage) sent from the bas station concentrator 12. The corrected control voltage is inputted to the VCO 30, and VCO 30 oscillates at a frequency corresponding to the input control voltage. The clock generated by the VCO 30 is the master clock of the base station 13, which is supplied to individual functional parts in the base station 13.

The correction may be applied not to the VCO 30 but to the free-running counter 31. In this case, another free-running counter 39 (see FIG. 3), separate from the free-counter 31, is also corrected, and operating timings of individual functional parts in the base station 13 are adjusted on the basis of the counter values of the free-running counter 39 after corrected.

In the example above, the control information generator 21 is included in the base station concentrator 12, and the corrector 33 is included in the base station 13. Assigning the functions in this way is effective when sending the correction voltage instruction to the base station 13 requires a very small amount of control data, because the amount of data transmission between the base station concentrator 12 and the base station 13 can be optimized. For example, suppose that the VCO 30 requires an amount of correction $\Delta v$ for a frequency deviation $\Delta f$. The control information generator 21 does not give an instruction for the correction of $\Delta v$ at one time, but it gives an instruction for, e.g., $\Delta v/16$, to achieve the correction slowly. This processing enables optimization of the amount of data transmission, and also makes it possible to deal with short-time variations of the output of the integrator 27, like loss of the output of the free-running counter 39 (see FIG. 3).

The control information generator 21 may be included in the base station 13, and the corrector 33 may be included in the bas station concentrator 12. Including the control information generator 21 in the base station 13 is beneficial because differences among individuals units due to VCO characteristics etc. can be absorbed within the base stations 13. When the corrector 33 is included in the base station concentrator 12, the base station concentrator 12 can apply centralized control to the free-running counters 31 in a plurality of base stations 13, which facilitates provision of additional intelligent functions. For example, when the base station concentrator 12 is applying the same control to base stations 13 with the same VCO configuration, it is possible to compare operations with other base stations 13 to easily detect abnormal base stations 13.

FIG. 3 is a diagram illustrating a detailed configuration of the portion downstream of the VCO in a base station. This diagram shows a configuration of a W-CDMA base station 13. The master clock generated by the VCO 30 in the base station 13 is supplied to individual functional parts in the base station 13. The base station 13 includes the VCO 30, and a wired interface (I/F) 34, PLLs (Phase-Locked Loops) 35, 36, a channel coding/decoding section 37, a modulator-demodulator 38, and the free-running counter 39.

The wired interface 34 performs data transmission and reception to and from the base station concentrator 12 and the base station controller 11. The PLL 35 is a circuit that varies the oscillation frequency of 16 MHz outputted from the VCO 30 to 32 MHz. The PLL 36 is a circuit that varies the oscillation frequency of 32 MHz outputted from the PLL 35 to 64 MHz. The channel coding/decoding section 37 is a W-CDMA channel coding/decoding component defined by 3GPP. The modulator-demodulator 38 is provided separately form the free-running counter 31 used to correct the output of the VCO 30, and it is a counter that supplies reference timings to individual functional parts in the base station 13.

Next, the operation illustrated in FIG. 3 will be described.

Supposed that the oscillation frequency of the VCO is originally specified to be 16 MHz, and the base station 13 has corrected the oscillation frequency of the VCO 30 by +0.5 ppm, for example. Then, the oscillation frequency 16 MHz+ 0.5 ppm of the master clock outputted from the VCO 30 is inputted to the wired interface 34 that operates with a clock of 16 MHz. The wired interface 34 thus operates at 16 MHz+0.5 ppm that is timing-adjusted (synchronized) to the master clocks of other base stations 13 connected to the base station concentrator 12.

Also, since the oscillation frequency of the output of the VCO 30 is 16 MHz+0.5 ppm, the channel coding/decoding section 37 that operates at 32 MHz, i.e. twice 16 MHz, operates with the clock of 32 MHz+0.5 ppm outputted from the PLL 35. It has thus been timing-adjusted to the clocks used by the channel coding/decoding sections 37 of other base stations 13 connected to the base station concentrator 12.

Also, the clock of 32 MHz outputted from the PLL 35 is further varied to 64 MHz by the PLL 36, and supplied to the modulator-demodulator 38 that operates at 64 MHz. The clock of 64 MHz outputted from the PLL 36 is also 64 MHz+ 0.5 ppm because of the correction of the master clock of the VOC 30. Accordingly, the clock supplied to the modulator-demodulator 38 is 64 MHz+0.5 ppm, which has also been timing-adjusted to the clocks used by the modulator-demodulators 38 in other base stations 13 connected to the base station concentrator 12.

Also, the phase of the free-running counter 39 is adjusted to 16 MHz+0.5 ppm from the VCO 30, and so the reference signals to the functional parts 34, 37, 38 have also been timing-adjusted to reference signals in other base stations 13 connected to the bas station concentrator 12.

Thus, the clocks supplied to all functional parts in the base station 13 have been timing-adjusted by correcting the oscillation frequency of the VCO 30, which is more efficient than individually timing-adjusting respective functional parts by sending a frame synchronization signal. Also, this enhances the performance of radio transmission and reception between the base stations 13 and mobile communications terminals.

In this way, according to the first preferred embodiment, it is possible to prevent increases of master clock frequency deviations over a long time, between the base stations 13 and the base station concentrator 12. It is thus possible to match all master clocks of the base stations 13 to the timing of the master clock of the base station concentrator 12 within a permissible range. It is also thus possible to march the oscillation frequencies of the master clocks among the base stations 13 (#1 to #n) within a permissible range. This avoids breakage of communication between the base station controller 11 and the base stations 13 and between the base stations 13 and mobile communications terminals.

In particular, it is extremely beneficial because precise synchronization can be established among the base stations even when the base stations 13 and the base station concentrator 12 are connected through an asynchronous network such as Ethernet (registered trademark) and clocks cannot be extracted via the circuit.

Also, providing the control information generator 21 and the phase comparator 23 not in the base stations 13 but in the base station concentrator 12 allows reduced circuit scale and lower price of the base stations 13.

Also, it is possible to prevent the base station controller 11 from becoming unable to recognize the plurality of base stations 13 as a single base station through the single base station concentrator 12.

Also, it is possible to match the phases even when there is a phase shift over one period (over 360 degrees) by using high-resolution counters in the comparison of phase differences of the master clocks and adjusting till the counter values become the same.

Furthermore, in the W-CDMA, there are following three effects.

Effect (1): Stabilization of wired data send/receive windows.

Effect (2): Stabilization of search windows.

Effect (3): Perfect synchronization at chip level.

Effect (1) means stabilization of the timing width used for data send/receive between the base station controller 11 and the base stations 13. Effect (2) means stabilization of the window width for path search in the modulator-demodulator 38 in the base stations 13. Effect () means timing synchronization of scrambling code and channelization code used in the modulator-demodulators 38 in the base stations 13. The Effects (1) to (3) will be described in detail below.

FIG. 4 is a diagram illustrating master clocks of base stations. The diagram shows counter values generated on the basis of the master clocks of two base stations #1 and #2, among a plurality of base stations connected to the same base station concentrator 12. Before time T1 at which a correction of the master clocks of the base stations 13 starts, there is a gap (Phase difference) between the counter value of the base station #1 and the counter value of the base station #2. The master clock correction is accomplished between the time T1 at which the correction started and time T2 at which the correction ends. During this period, the oscillation frequency of the VCO 30 of the base station #2 is varied. The frequency is increased when the clock phase of the base station #2 is lagging behind the clock phase of the base station #1, and the frequency is reduced when the clock phase of the base station #2 is leading ahead of that of the base station #1.

FIG. 5 is a diagram used to explain Effect (1). FIG. 5 shows, from the top, the counter value of the base station concentrator 12, the counter value of the base station #1, and the counter value of the base station #2 that are arranged on the time base. FIG 5(a) shows a condition before the correction of master clocks of the base stations, and FIG. 5(b) shows a condition after the correction.

In FIG. 5(a), before the time T1 at which the correction of master clocks of the base stations #1 and #2 starts, the counter value of the base station #1 and the counter value of the base station #2 differ in timing. Accordingly, when downlink data D is sent from the base station controller 11 that is assuming there is a single base station, the base station #1 can receive the data D because the receiving timing is within the receiving window, but the other base station #2 cannot receive the data D because the receiving timing is not within the receiving window, and then the communication is broken.

In FIG. 5(b), after the time T2 as which the correction of the master clocks of the base stations #1and #2 finished, the counter value of the base station #1 and the counter value of the base station #2 are adjusted to each other such that their receiving windows do not considerably differ in timing, and they are in fixed relative positions. Accordingly, when the downlink data D is sent from the base station controller 11 assuming there is a single base station, the receiving timing of both base stations #1 and #2 are within the receiving windows. The base station controller 11 is thus able to send the downlink data D to both base stations #1 and #2, and the communication is not broken.

In the conventional technique in which the base station concentrator just supplies a frame synchronization signal to the lower-level base station, the timing of the frame synchronization signal varies due to the circuit between the base station concentrator and the lower-level base stations, and so it is impossible to match the receiving windows among a plurality of base stations and to fix the relative positions of the receiving windows among the plurality of base stations.

For the sake of simplicity, FIG. 4 shows an example in which the period of "master clock being corrected" corresponds to about three pulses, but, in practice, the correction is achieved slowly (in 3GPP, the correction is achieved with counter value=5 per $10^8$ pulses) within a range corresponding to the frequency stability permissible for the communications system (in 3GPP, the frequency stability is ±0.05 ppm).

FIG. 6 is a diagram used to explain Effect (2). A base station #1 and a base station #2 are connected to the same W-CDMA base station concentrator 12 and the two base stations #1 and #2 are communicating with the same mobile communications terminal in a soft handover condition, and FIG. 6 shows search windows indicating time ranges in which the base stations #1 and #2 can demodulate an uplink signal from the mobile communications terminal and perform a search for detecting correlation pulses of path. The positions of the search windows in time are determined on the bases of the counter values of the base stations #1 and #2.

FIG. (6)a shows the search window positions of the base stations and the detected correlation pulses of the path at the time when the communication with the mobile communications terminal started immediately after the base stations were turned on. In this case, the master clocks of the base stations have not been corrected, but the counter values have no deviation yet that would be caused by phase shift of the master clocks. That is, the search windows of the individual base stations indicate the same timing (assuming that the distances between the individual base stations and the mobile communications terminal are equal), and the individual base stations are both detecting a path correlation pulse. In this condition, the soft handover process successfully functions in which the base stations concentrator 12 makes the base station controller 11 recognize the base stations as a single station.

However, the counter values deviate from each other as time passes, because of a difference in master clock oscillation frequency between the individual base stations. Suppose that, before the counter values thus deviate, the base station controller 11 indicated channel setting for soft handover to the base stations 13 (#1, #22) through the base station concentrator 12. Offset information (a difference from a reference signal of measured by the mobile communications terminal during the communication with the base station #1 is reported to the base station controller 11. The base station controller 11 indicates the offset information of the mobile communications terminal to the base station #2.

Next, suppose that the communication is continued for a long time, with the connections being simultaneously made with the base station #1 and base station #2. When the base station #1 seems to be primary for the mobile communications terminal (that is, when the base station #1 seems to be a primary-cell according to 3GPP), the counter value of the base station #2 is deviated because of a difference in the oscillation frequency of the master clock from that of the base station #1. Accordingly, in reality, as shown in FIG. 6(*b*), its search window is formed in a position shifted from that of the base station #1, and it cannot detect the correlation pulse of the path. Then, the mobile communications terminal cannot perform desired communication, though it originally ensures its communication quality by soft handover.

When the oscillation frequencies of the master clocks of the base stations are corrected, the positional relation of the search windows of the base stations #1 and #2 does not change relatively to each other, and, as shown in FIG. 6(*c*), it is possible to continuously detect the correlation pulse of the path over a long period of time. The communication is not broken even when the mobile communications terminal moves into a non-overlapping area of one of the base stations. That is, the soft handover functions without any problems. The stabilization of search windows means this effect.

In this conventional technique in which the base station concentrator only supplies a frame synchronization signal to lower-level base stations, the timing of the frame synchronization signal varies due to the circuit between the base station concentrator and the lower-level base stations, and it is impossible to match the positions of search windows among the base stations and to fix the relative positions of the search windows.

Now, a situation under the conditions below will be described in detail.

Condition (a): There is a base station having a cell with a small radius in which the time width of path search by correlating (the width of search window) is 32 chips. The time for 1 chip corresponds to 0.26 μs, and so 32 chips correspond to 8.3 μs.

Condition (b): The phase of the counter value, based on the master clock, of the base station #1 lags by 3 μs per 10 minutes behind that of the base station #2.

Condition (c): The mobile communications terminal is located in the overlap of the cell of the base station #1 and the cell of the base station #2, and standing still in a handover position. The base station #1 is the primary-cell.

Condition (d): The base stations #1, #2 and the base station concentrator 12 are connected through and IP network. As defined as ITU-T recommendation Y.1541 class 0 there is a model in which passage through an IP network may cause a delay of 50 ms, and so a drift of 50 ms may occur.

Condition (e): The free-running counters 22 and 31 of the base stations and the base station concentrator are counted up according to master clocks of 16 MHz. That is, they are counted up by one per 0.0625 μs.

Under the conditions (a) to (e) the master clocks have no phase difference at the first instance of path detection, and so the search windows are in the same positions. Accordingly, the base station #2 is able to detect the path when the chip offset information as path position information (assumed to be 10 chips=2.6 μs) is sent from the base station #1 to the base station controller 11 and the same information is sent to the base station #2.

When there is no function to correct the master clock oscillation frequencies of the base stations, the free-running counter of the base station #2 by 2.6 μs after 520 seconds passed, and so it search window is formed in a position lagging by 2.6 μs behind the search window of the base station #1 when the base station #2 receives the chip offset information of 10 chips from the base station controller 11. Then, the base station #2 cannot detect the path, and the communication between the base station #2 and the mobile communications terminal is broken, and handover fails.

When there is a function to correct the master clock oscillation frequencies of the base stations, the base station concentrator 12 obtains and averages information about the master clock oscillation frequencies from the base stations for 50,000 ms (=50 seconds) which is sufficiently longer than 50 ms, so as to cancel drifts of about 50 ms in the IP network transmission. When averages, the difference between the counter values of the base station #1 and the base station concentrator 12 was +6 (0.375 μs), and the difference between the counter values of the base station #2 and the base station concentrator 12 was ±2 (0.125 μs). Then, on the basis of the table storing a relation between counter value difference and VCO control voltage, the base station concentrator 12 applies a correction of −0.006 V (an example) to the base station #1 to shorten the master clock cycle by 0.375 μs÷50 seconds=0.0075 μs just once, and also applies a correction of −0.002 V (an example) to the base station #2 to shorten the master clock cycle by 0.125 μs÷50 seconds=0.0025 μs. In this way, the master clock oscillation frequencies of the base station #1 and the base station #2 are corrected once per 50 seconds, and the search window of the base station #2 is corrected once in every 50 seconds such that it will not deviate in position from the search window of the base station #1.

Now, a further effect applied to both Effects (1) and (2) will be described.

On the occurrence of IP routing table variations, variations of average delay time due to IP network load variations (due to huge packets like FTP (File transfer protocol)), drifts between the base station concentrator 12 and base stations 13, and the like, the averaging operation is performed once for every 50 seconds as explained above, wherein, for example, corrections are applied according to the differences between counter values by the averaging in the first 50 seconds (for example, a correction of control voltage of −0.006 V for a counter value difference=+6 in the base station #1, and a correction of control voltage of −0.002 V for a counter value difference=+2 in the base station #2), and then, an average delay time occurs, and corrections are applied according to the differences by the averaging in the next 50 seconds (for example, a correction of control voltage of −0.002 V for a counter value difference=+2 in the base station #1, and a correction of control voltage of 0.0 V for a counter value difference=±0 in the base station #2).

The averaging also suppresses bursting data delay drifts.

Also, it is necessary to remove fixed delays to some extent, in order to establish synchronization among base station. Otherwise, it is not possible to deal with condition in which, for example, the base station #1 has a fixed delay of 100 μs and the base station #2 has a fixed delay of 30 ms. Such conditions can be dealt with by providing the base station concentrator 12 with a time information server function, such as the NTP (Network Time Protocol) server function. When a lower-level base station 13 (#1) connected to the base station concentrator 12 sends a request for time to the base station concentrator 12, the base station 13 is informed of time. Then the fixed delay of the base station 13 can be removed to some extent, and the count value differences between the base station 13 and the base station concentrator 12 can be precisely calculated. The quantity of such fixed delay is set as counter initial value when the base station 13 is activated.

FIG. 7 is a diagram illustrating a fixed delay between a base station and the base station concentrator. FIG. 8 is a diagram used to explain a procedure for removing the fixed delay. In FIG. 8, the base station concentrator 12 shown in FIG. 2 further includes a time adjustment section 40 having a time information server function. Now, the procedure for removing fixed delay will be sequentially described referring to FIGS. 7 and 8.

Step (1): The base station concentrator 12 sends an inquiry signal to ask a lower-level base station 13 for a request for time information.

Step (2): The base station 13 sends a time information request to the base station concentrator 12 (send time A1). The time information request is received at the base station concentrator 12 and transferred to the time adjustment section 40 (receive time M1).

Step (3): The time adjustment section 40 of the base station concentrator 12 generates time information according to the request, and send the generated time information back to the base station 13 as a response to the request (send time M2). The time information response is received at the base station 13 (receive time A2).

Step (4): The base station 13 corrects the time on the basis of the time information thus sent. In this process, the amount of correction of the time of the base station 13 is calculated according to the expression below:

$$((A2-A1)-(M2-M1))/2$$

It should be noted that the propagation delays of data transmission and reception of the base station 13 and the base station concentrator 12 are assumed to be equal. Accordingly, it is not always possible to make the time of the base station 13 precise, but it is possible to remove the fixed delay in data transmission between the base station 13 and the base station concentrator 12 by subtracting the calculated fixed delay time form the counter value of the base station 13.

It is also effective to calculate IP network fixed delay time by providing the base stations 13 with a time information server function.

It is also effective to cause the base station concentrator 12 to request time information from the base station 13, receive time information from the base station 13, calculate the fixed delay, and send the result to the free-running counter 31 of the base station 13, so as to correct the counter value of the free-running counter 31 of the base station 13.

It is effective to activate the fixed delay calculating process at some time intervals. It is also effective to obtain an average a sufficient number of time and over a sufficient time period, so as to reduce the influences of loss of IP packets or the influences of bursting drifts of fixed delay calculation packets.

Next, Effect (3) will be described referring to FIGS. 9 to 11.

For Effect (3), "chip" means one pulse after spread in CDMA. Hereinafter, a state in which synchronization is established at the chop level is referred to as chip-level synchronization.

When perfect chip-level synchronization is established such complicated situations as shown in FIG. 9 will not occur where the base station #1 sends Timing-adjustment for downlink data, while the base station #2 does not send Timing-adjustment for the downlink data, because of a slight deviation of windows for wired data transmission/reception.

When chip-level synchronization is perfectly established and the base stations 13 (#1, #2) have small-radius cells as shown in FIG. 10, the chip-offset information and frame-offset information detected by the mobile communications terminal 14 can be used in the base station to which it has been handed over, which shortens the search time.

Also, when perfect chip-level synchronization is not established, as shown in FIG. 11, considering the maximum ratio combining performed with a signal sent to the base station concentrator 12 from a base station #1 located relatively distant and having a larger propagation delay and a signal sent to the base station concentrator 12 from a base station #2 located relatively near an having a smaller propagation delay, it is necessary to provide FIFO (First In First Out) buffers 42 (#1, #2) for queuing, in respective correspondence with the base stations #1 and #2 in a stage preceding the maximum ratio combining section 41.

In contrast, when chip-level synchronization is perfectly established, the delays between the base station concentrator 12 and the base stations 13 are small, and it is not necessary to provide such queuing FIFO buffers 42 as shown in FIG. 11 for the maximum ratio combining process performed by the maximum ratio combining section 41 in the base station concentrator 12, with soft decision information sent to the base station concentrator 12.

According to the present invention, in correcting the oscillation frequencies of the master clocks of base stations 13, an averaging is performed for considerably longer periods as compared to network drifts, in order to remove data loss and drifts caused in the IP network. Accordingly, Effect (3) is effective when it is known in advance that, as a system, data loss and drifts in the IP network between the base station concentrator 12 and the base stations 13 are suppressed sufficiently lower than chip level (when the communication does not pass via a hub or the like, or when the hub has an extremely high processing ability and ensures low delay, for example).

Second Preferred Embodiment

FIG. 12 is a diagram illustrating the configuration of a base station synchronization system according to a second preferred embodiment of the present invention. In the second preferred embodiment, a base station concentrating function section 52, which corresponds to the base station concentrator 12 of the first preferred embodiment (see FIG. 1), is incorporated in a base station controller 11. The base station controller 11 of the first preferred embodiment corresponds to a base station controlling function section 51 in the second preferred embodiment. The base station controlling function section 52 of the base station controller 11 and base stations 13 are W-CDMA equipment defined by 3GPP, for example. The base stations 13 and the base station controller 11 are connected through an IP network, for example. In other respects, the configurations, operations and effects are the same as those of the first preferred embodiments and so not described here again.

In this way, the base station concentrator 12 can be omitted when it is not necessary to connect a large number of base stations 13 to the base station controller 11.

The VCO 20 (which can be an OCXO or the like when voltage control is not required) and the control information generator 21 shown in FIG. 12, and the free-running counter 22 and part of the phase comparator 23, may be provided not within the base station concentrating function section 52, but may be provided outside the base station concentrating function section 52 but within the base station controller 11.

Third Preferred Embodiment

FIG. 13 is a diagram illustrating the configuration of a base station synchronization system according to a third preferred embodiment of the present invention. In a third preferred embodiment, the VCOs 20, 30 of the first preferred embodiment (see FIG. 1) are replaced by high-precision VCOs 60. The VCOs 60 are, for example, VC-OCXO (voltage-controlled, oven-controlled crystal oscillators) or VC-DTCXO (voltage-controlled, digital temperature-compensated crystal oscillators), which are capable of generating high-precision master clocks. In other respects, the configurations, operations and effects are the same as those of the first preferred embodiment and are not described again here. In this preferred embodiment, too, the oscillator in the bas station concentrator 12 may be an OCXO, DTCXO or the like, in place of VCO, when voltage control is not required.

The free-running counter frequency is used for RF (Radio Frequency) transmission reference, and do the frequency is changed at a rate at which frequency deviations can be kept permissible. This changing rate is very low, and when the frequency is change by 0.01 ppm, for example, the correction can be made only by 36 μs per hour. Accordingly, with high-precision clocks, it is not necessary to very frequently correct the master clock oscillation frequencies in the base stations 13.

The high-precision VCO 60 may be applied only to the base stations 13, or only to the base station concentrator 12. This offers enhances precision in the correction of master clock oscillation frequencies, than when the high-precision VCO 60 is not applied.

Fourth Preferred Embodiment

FIG. 14 is a diagram illustrating the configuration of a base station synchronization system according to a fourth preferred embodiment of the present invention. In the fourth preferred embodiment, a selector 71 is added to the first preferred embodiment (see FIG. 2), and the phase comparator 23 is replaced by a phase comparator 72.

Among counter values of the free-running counter 31 of the base station 13, the selector 71 sends a counter value inputted at a certain time as an initial value to a free-running counter 22 of the base station concentration 12. Also, after a certain time has passed after sending the initial value to the free-running counter 22, the selector 71 again sends the count value of the free-running counter 31 of the base station 13 to the phase comparator 72 in the base station concentrator 12. The selector 71 may be integrally incorporated in the phase comparator 72.

Like the phase comparator 23 of the first preferred embodiment, the phase comparator 72 compares phase information from the free-running counter 22 of the base station concentrator 12 with phase information from the free-running counter 31 of the base station 13. However, the phase comparator 72 is formed only of the subtracter 24, among the components of the phase comparator 23 of the first preferred embodiment.

In other respects, the configurations, operations and effects are the same as those of the first preferred embodiment, and so not described here again.

The selector 71 can be omitted when the base station 13 is configured to supply the count values to the base station concentrator 12 at certain time intervals. Alternatively, the base station concentrator 12 may specify the timing of supply of count values from the base station 13 to the base station concentrator 12. In this case, the base station 13 supplies its counter values to the base station concentrator 12 according to a timing based on the instruction from the base station concentrator 12.

While FIG. 14 illustrates a configuration including the base station concentrator 12 in addition to the base station controller 11, a base station concentrating function section 52 may be incorporated in the base station controller 11 as shown in the second preferred embodiment (see FIG. 12).

Fifth Preferred Embodiment

FIG. 15 is a diagram illustrating the configuration of a base station synchronization system according to a fifth preferred embodiment of the present invention. In the fifth preferred embodiment, the control information generator 21, the selector 71, and the phase comparator 72, which are provided in the base station concentrator 12 in the fourth preferred embodiment (see FIG. 14), are provided in the base station 13.

Among counter values sent from the free-running counter 22 of the base station concentrator 12, the selector 71 sends a counter value inputted at a certain time as an initial value to the free-running counter 31 of the base station 13. Also, after a certain time has passed, the selector 71 again sends the count value sent from the free-running counter 22 of the base station concentrator 12 to the phase comparator 72 in the base station 13. The selector 71 may be integrally incorporated in the phase comparator 72.

The phase comparator 72 compares phase information from the free-running counter 31 of the base station 13 with phase information from the free-running counter 22 of the base station concentrator 12. However, the phase comparator 72 if formed only of the subtracter 24, among the components of the phase comparator 23 of the first preferred embodiment.

In other respects, the configurations, operations and effects are the same as those of the first preferred embodiment, and so not described here again. Characteristically, the fifth preferred embodiment simplifies the configuration of the base station concentrator 12 and realizes lower price.

The selector 71 can be omitted when the base station concentrator 12 is configured to supply count values to the base station 13 at certain time intervals. Alternatively, the selector 71 may be configured to switch its output according to an instruction from the base station concentrator 12.

BRIEF DESCRIPTION OF THE DRAWINGS

[FIG. 5] A diagram used to explain Effect (1).

Figure 1:
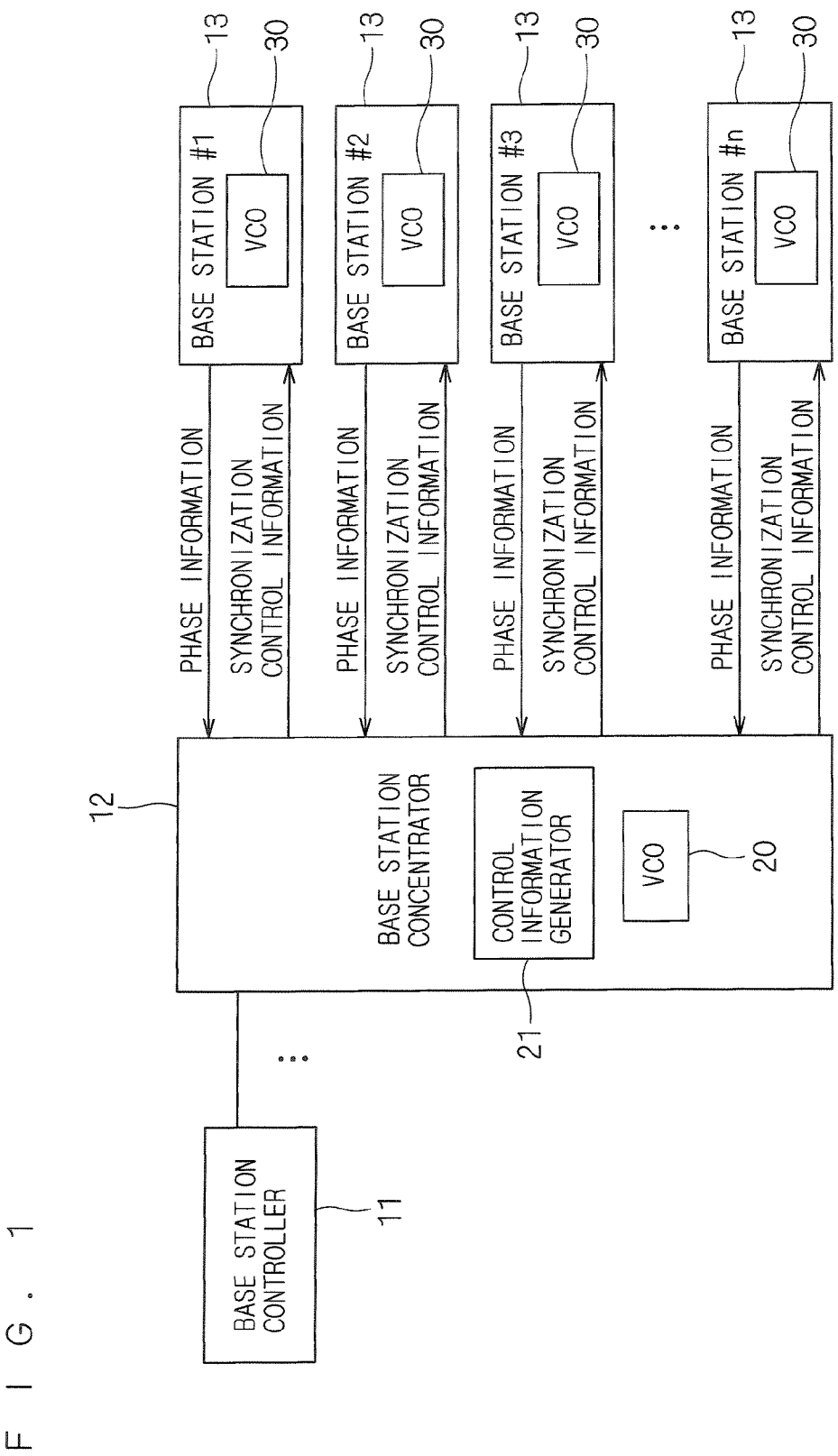
[FIG. 1] A diagram illustrating a network configuration according to a first preferred embodiment of the present invention.
Figure 2:
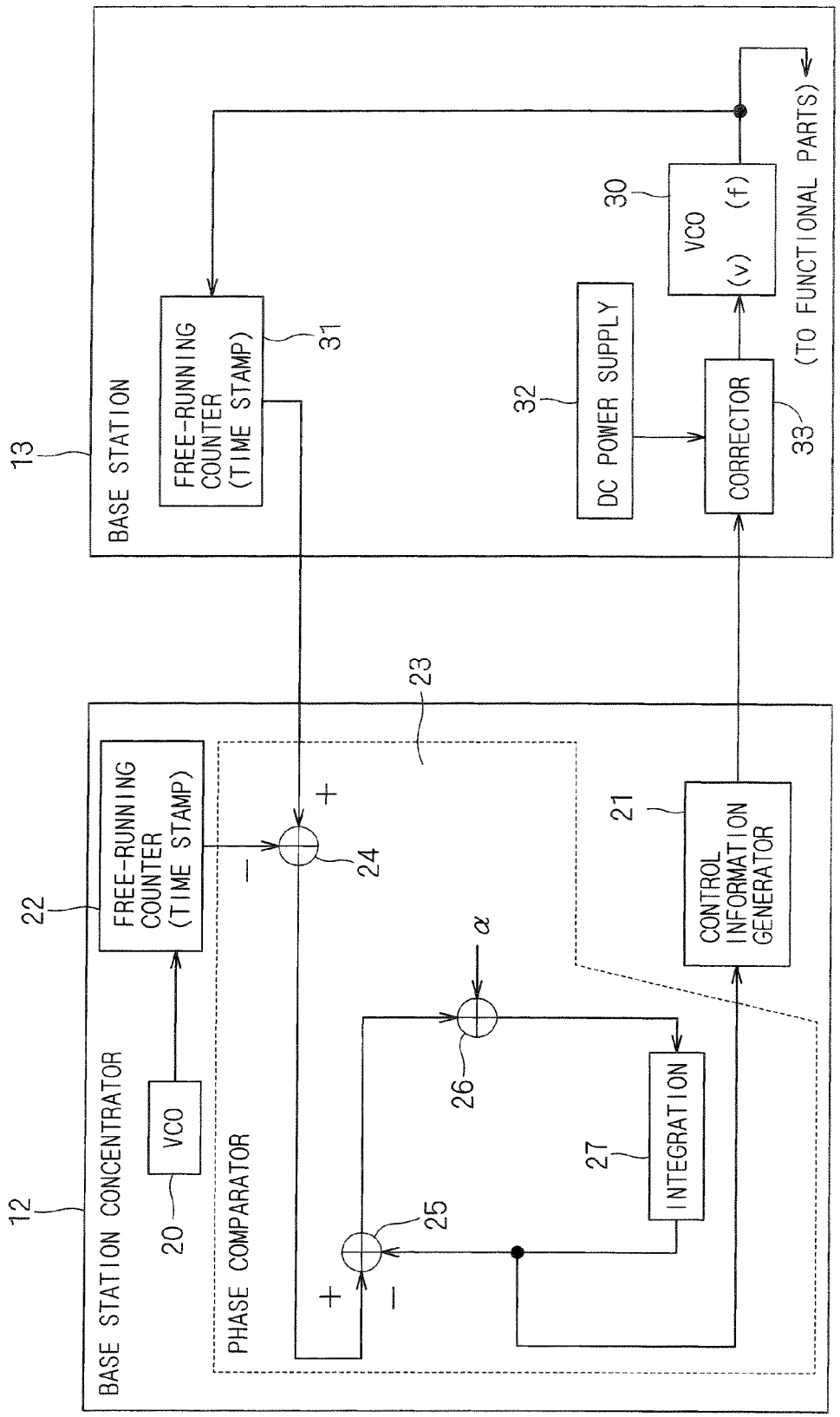
[FIG. 2] A diagram illustrating detailed configurations of a base station concentrator and a base station.
Figure 3:
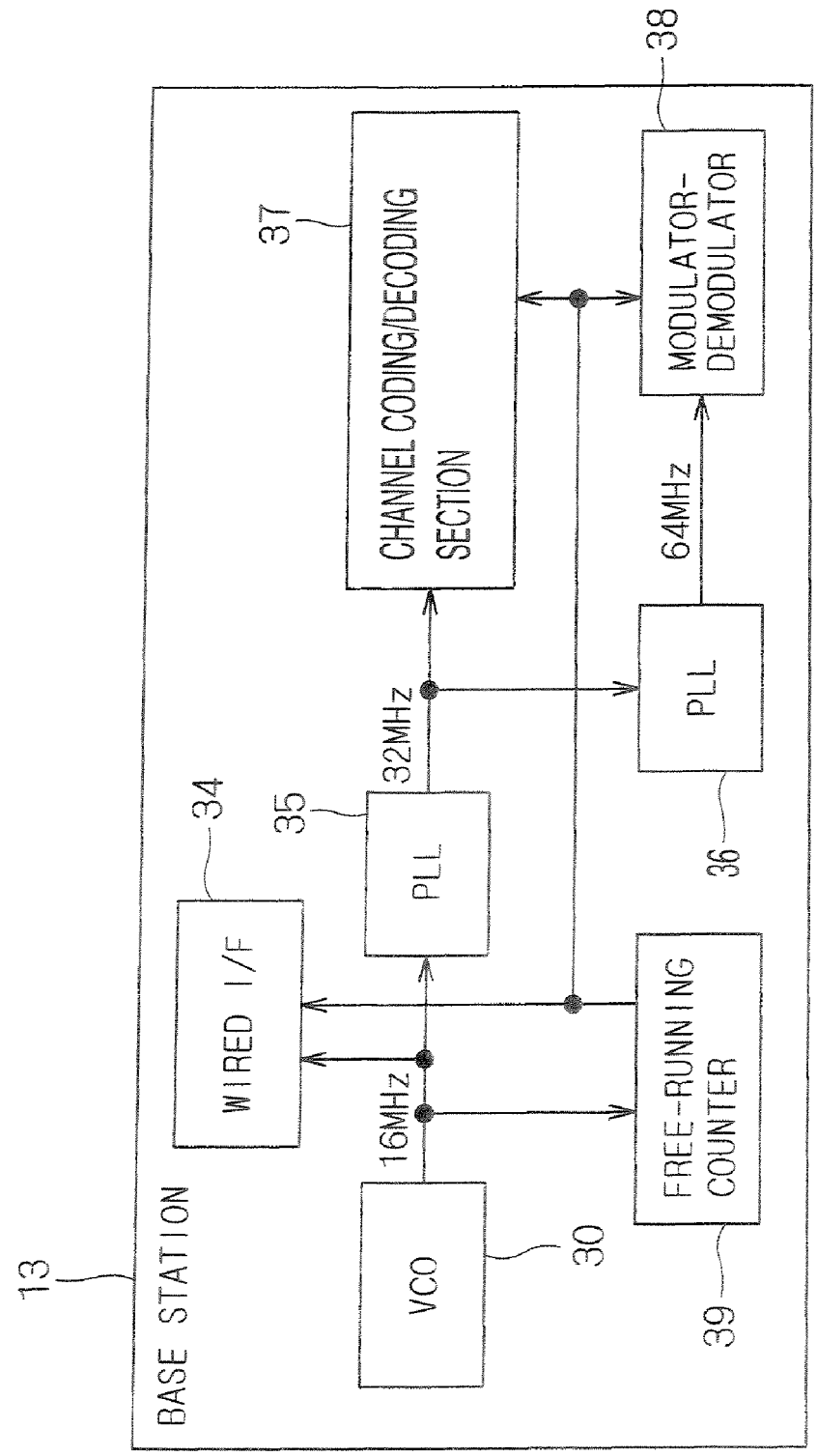
[FIG. 3] A diagram illustrating detailed configuration of the VCO and following components of the base station.
Figure 4:
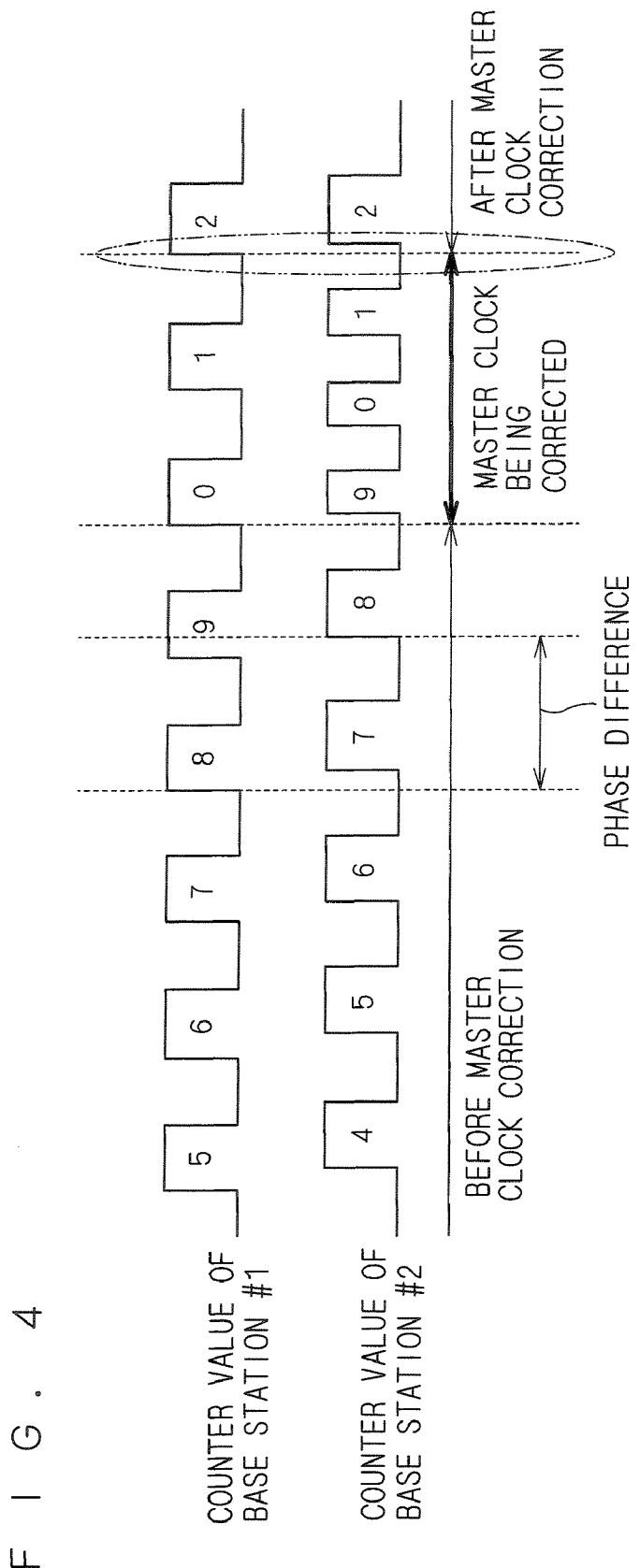
[FIG. 4] A diagram illustrating master clocks of base stations.
Figure 6:
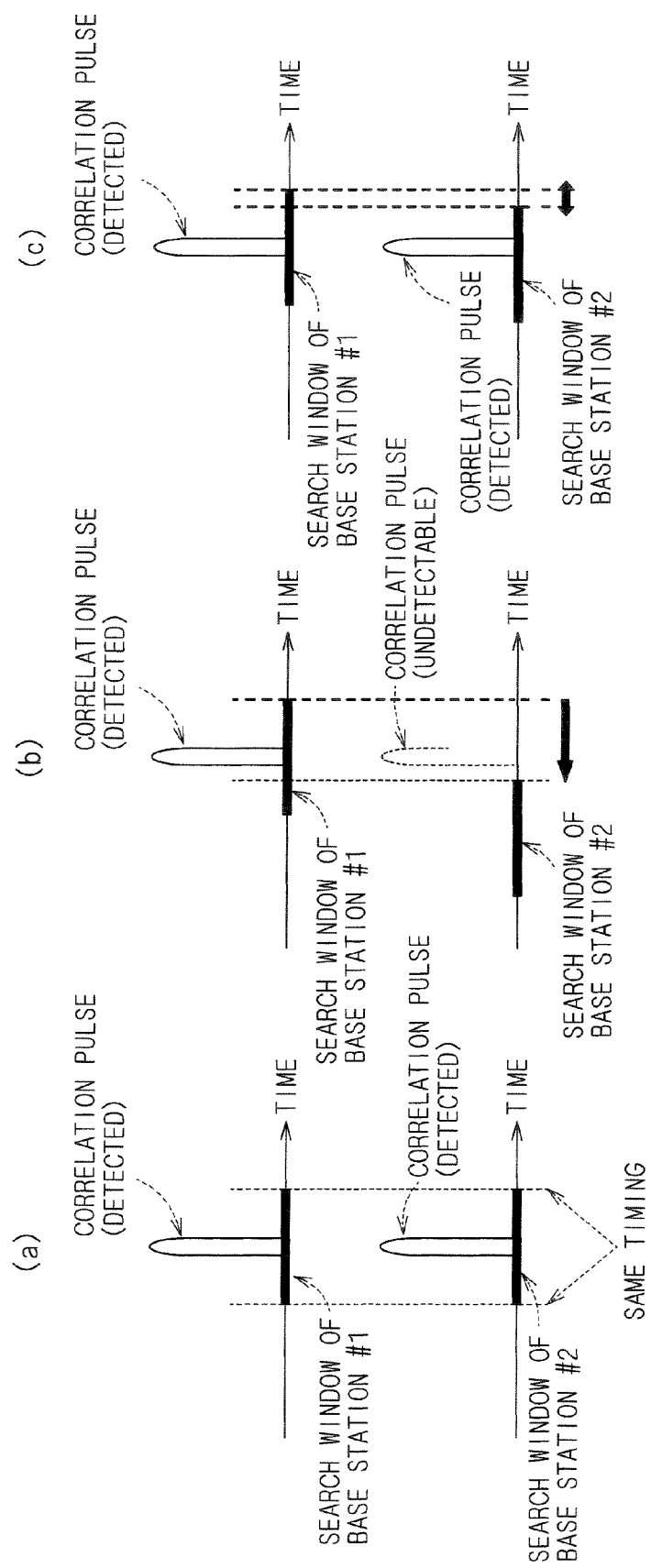
[FIG. 6] A diagram used to explain Effect (2).
Figure 7:
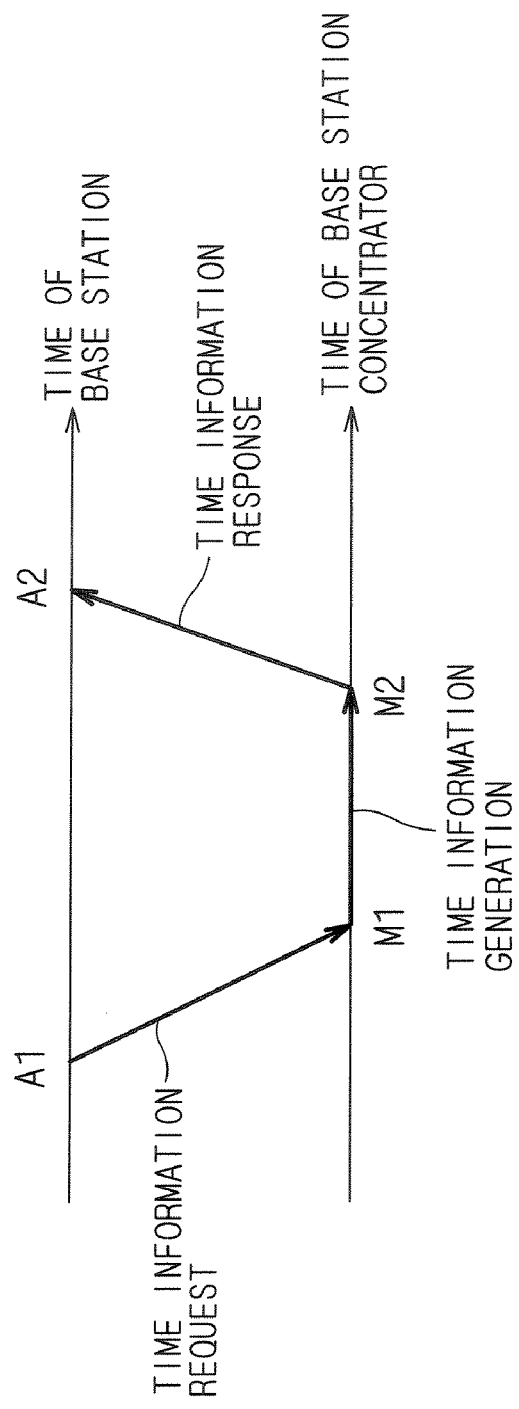
[FIG. 7] A diagram illustrating fixed delay between a base station and the base station concentrator
Figure 8:
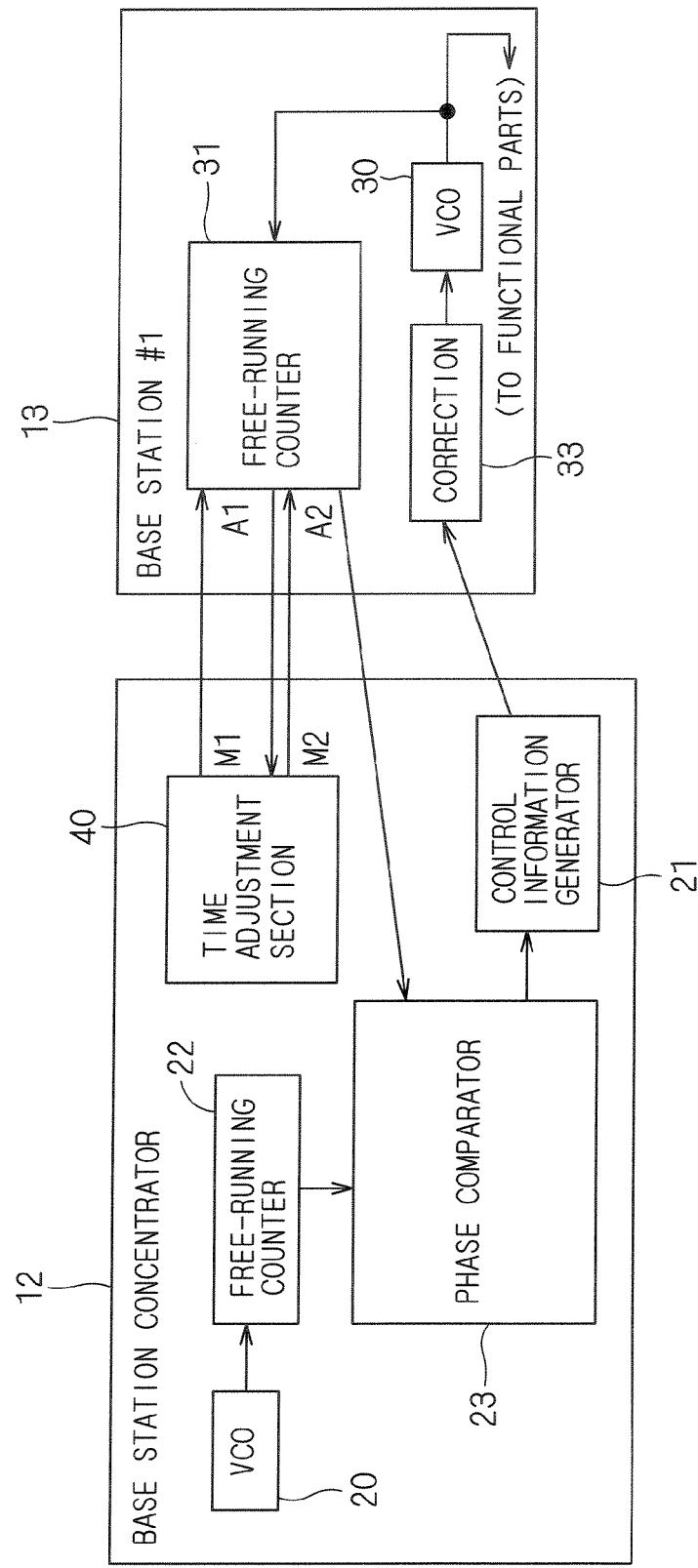
[FIG. 8] A diagram used to explain a procedure for removing fixed delay.
Figure 9:
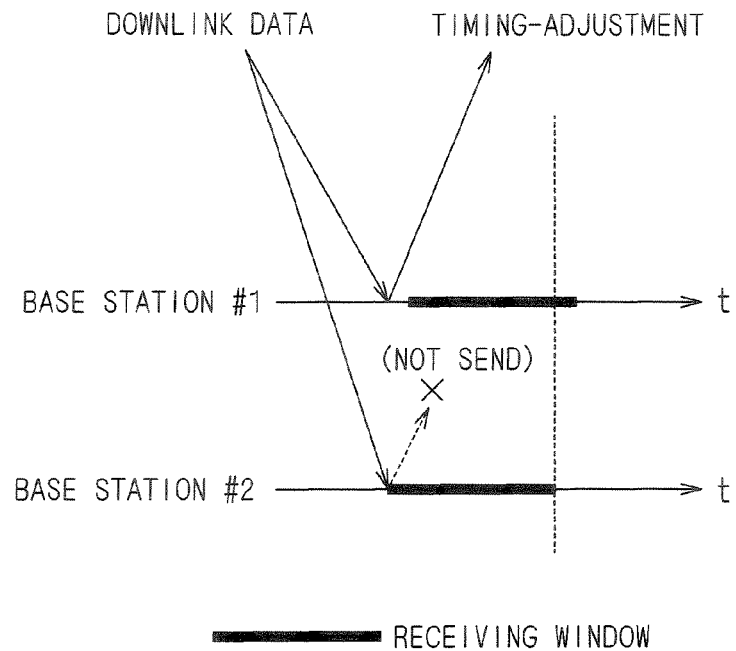
[FIG. 9] A (first) diagram used to explain Effect (3).
Figure 10:
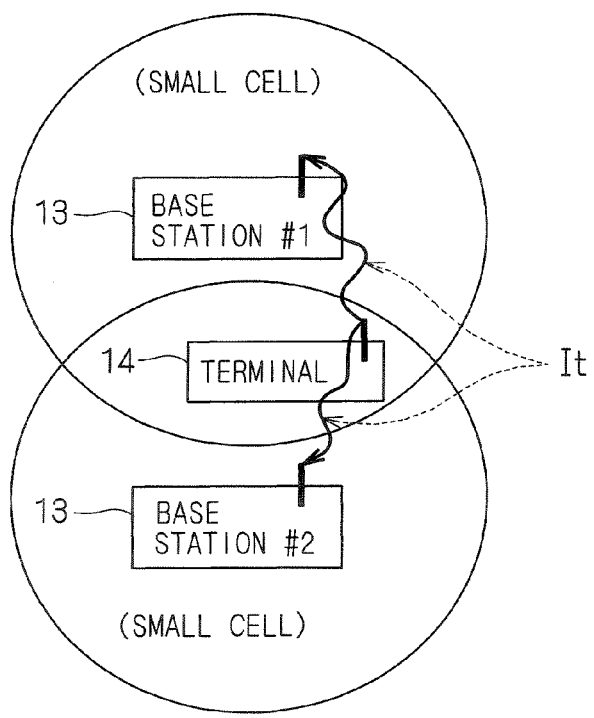
[FIG. 10] A (second) diagram used to explain Effect (3).
Figure 11:
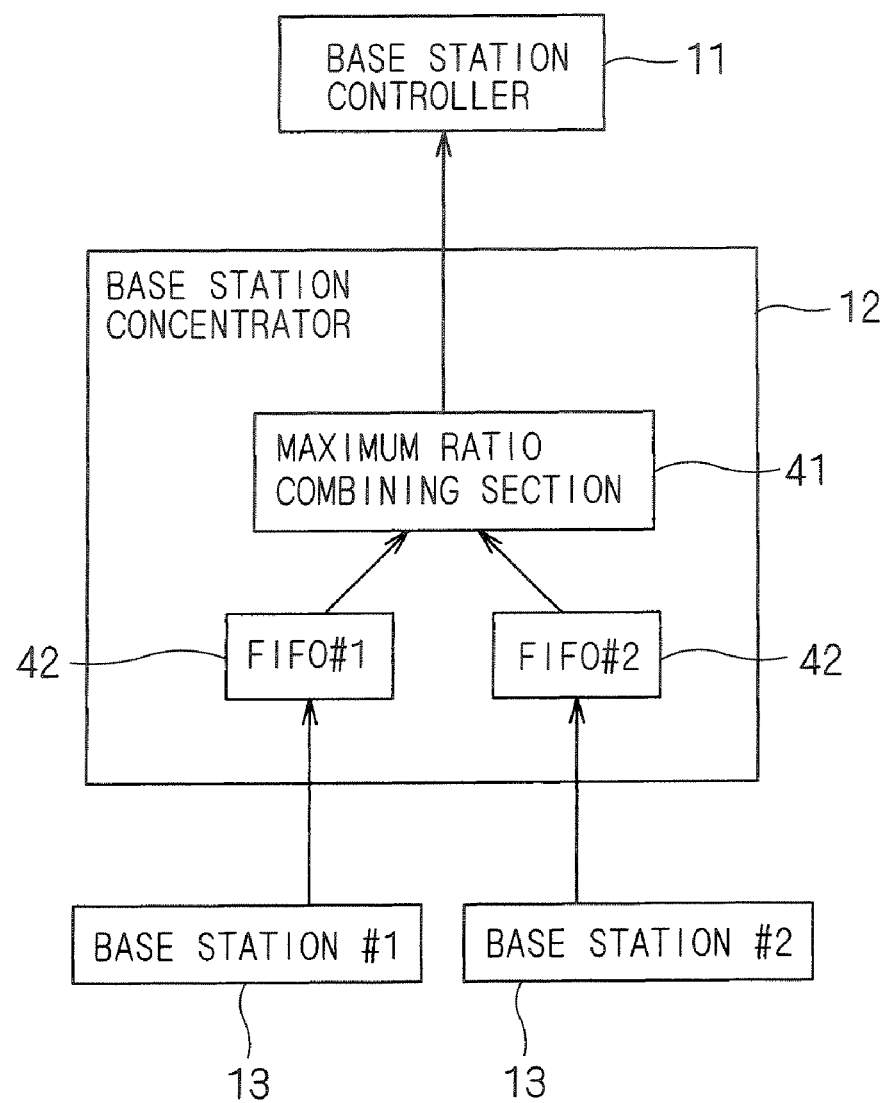
[FIG. 11] A (third) diagram used to explain Effect (3).
Figure 12:
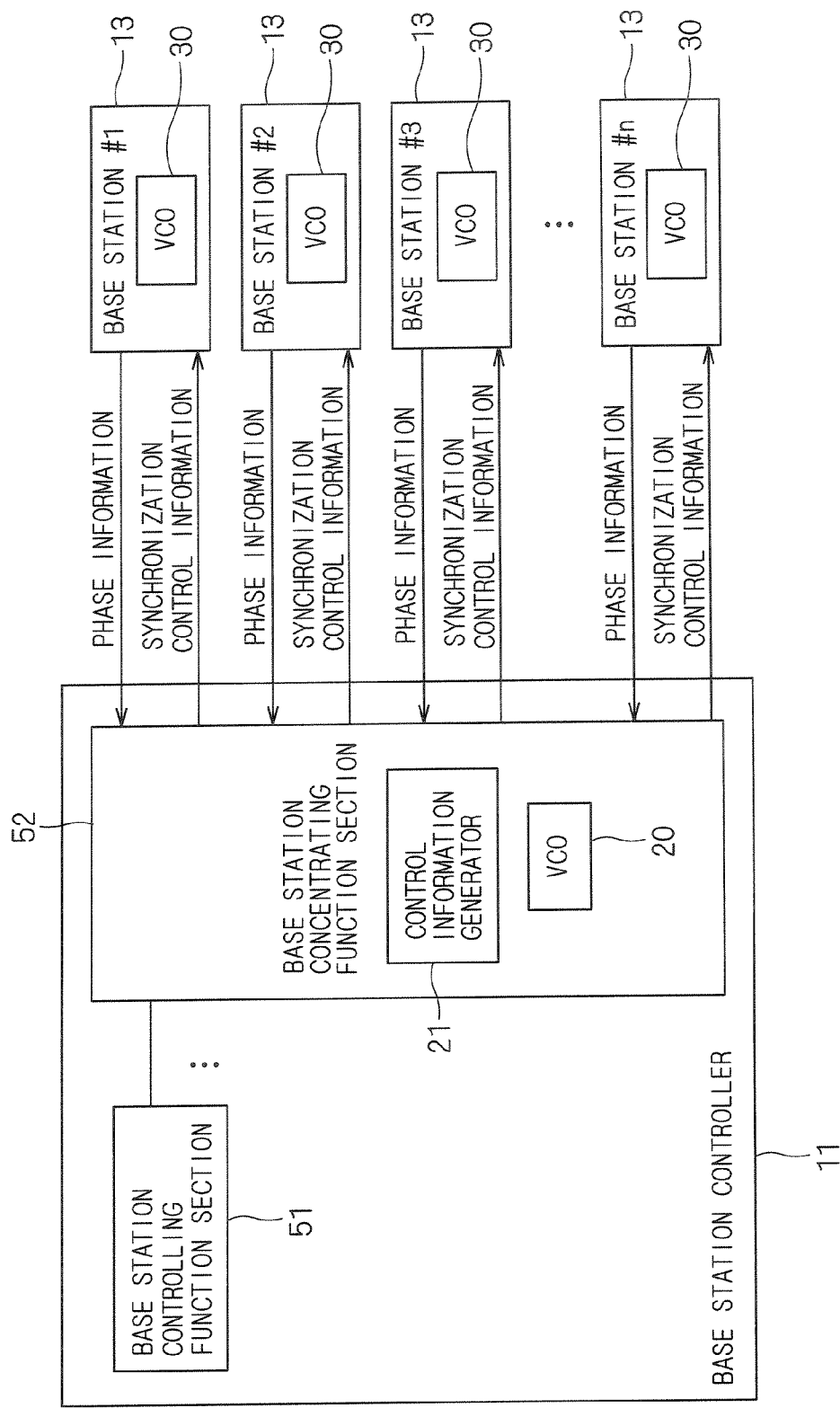
[FIG. 12] A diagram illustrating the configuration of a base station synchronization system according to a second preferred embodiment.
Figure 13:
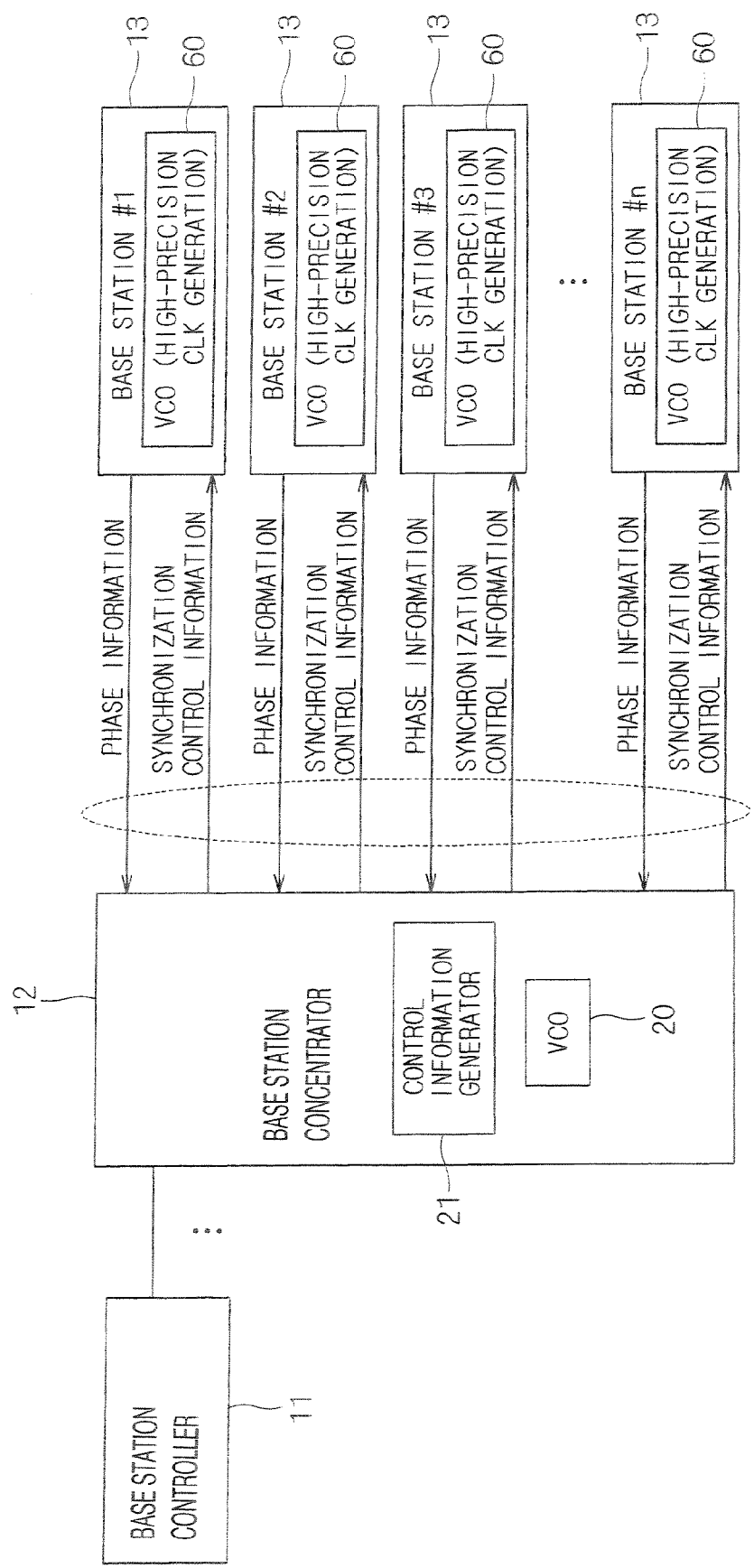
[FIG. 13] A diagram illustrating the configuration of a base station synchronization system according to a third preferred embodiment.
Figure 14:
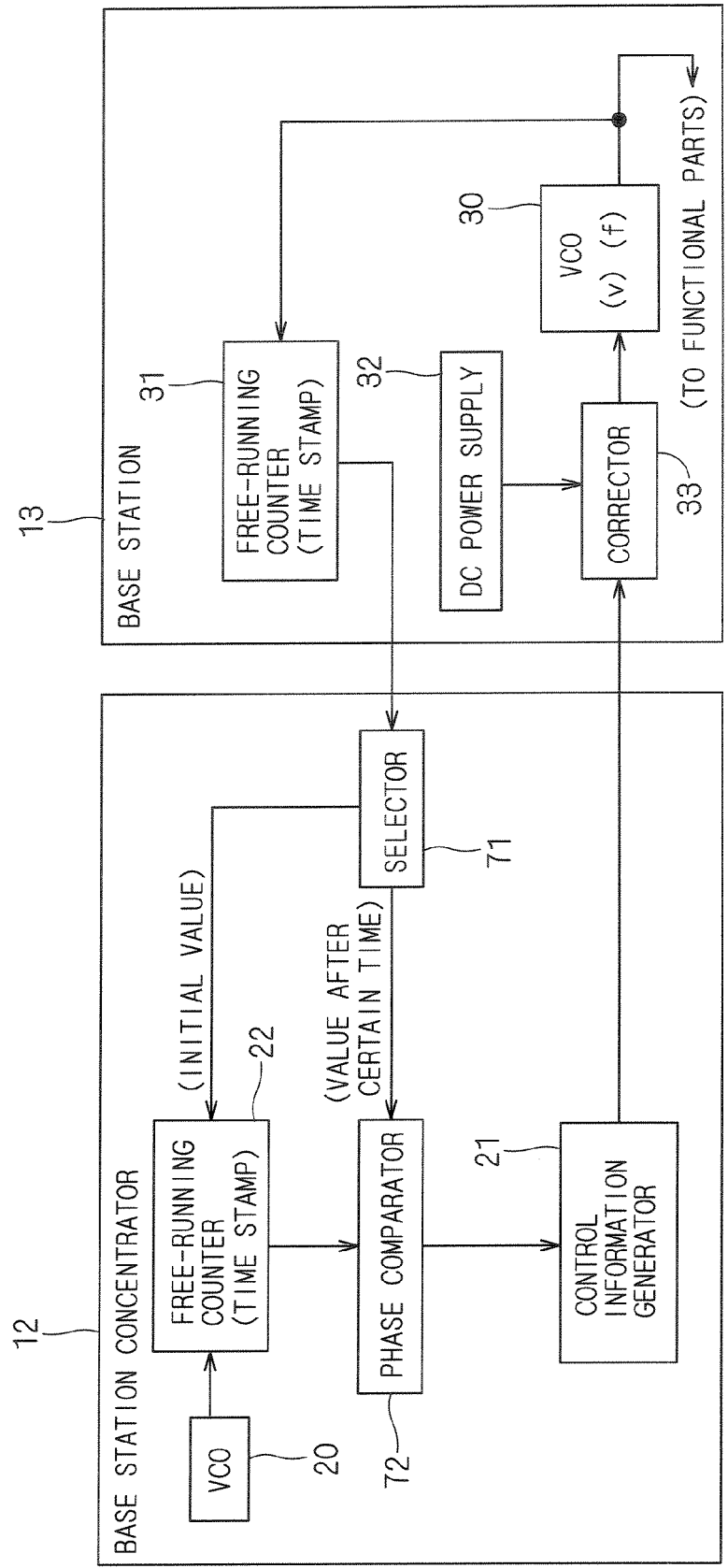
[FIG. 14] A diagram illustrating the configuration of a base station synchronization system according to a fourth preferred embodiment.
Figure 15:
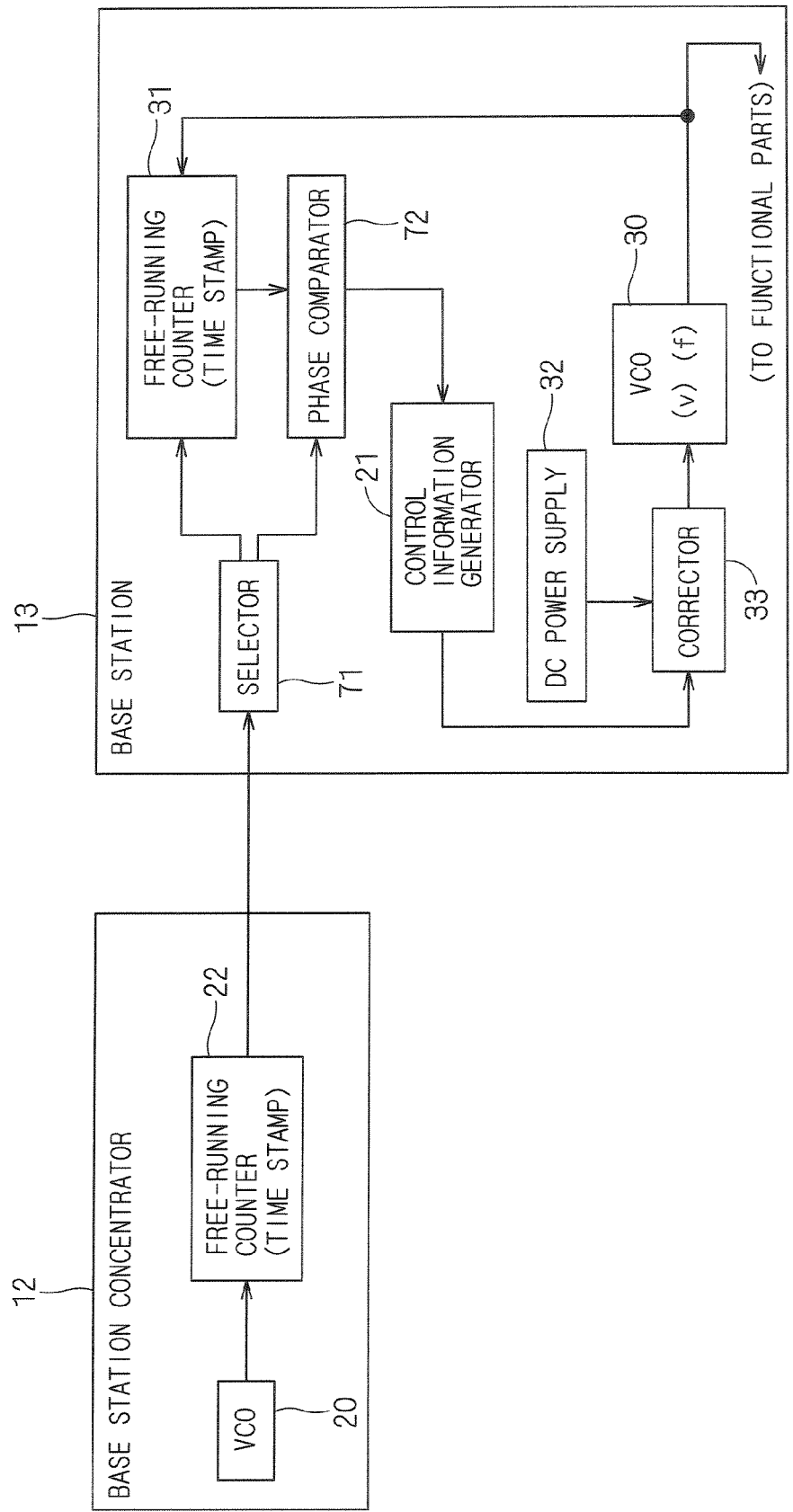
[FIG. 15] A diagram illustrating the configuration of a base station synchronization system according to a fifth preferred embodiment.

Description of the Reference Characters 11 base station controller
12 base station concentrator
13 base station
14 mobile communication terminal
20 VCO (Voltage-Controlled Oscillator)
21 control information generator
22 free-running counter
23 phase comparator
24,25 subtracter
26 multiplier
27 integrator
30 VCO (Voltage-Controlled Oscillator; master clock generator)
31 free-running counter
32 DC power supply
33 corrector
34 wired interface (I/F)
35,36 PLLs (Phase-Locked Loops)
37 channel coding/channel decoding section
38 modulator-demodulator
39 free-running counter
40 time adjustment section
41 maximum ratio combining section
42 FIFO buffer
51 base station controlling function section
52 base station concentrating function section
60 VCO (high-precision CLK generation)
71 selector
72 phase comparator
D data
A1 send time (time information request)
M1 receive time (time information request)
M2 send time (time information response
It information

What is claimed is:

1. A base station synchronization system comprising:
    a plurality of base stations;
    a synchronization controller that provides control to establish synchronization among said plurality of base stations, said synchronization controller including:
        a control information generator to generate synchronization control information for synchronizing master clocks of said plurality of base stations with each other, the synchronization control information using an average difference between a count value corresponding to a first frequency associated with the synchronization controller and a count value corresponding to a second frequency associated with a base station from the plurality of base stations; and
    each base station from said plurality of base stations including:
        a master clock generator that oscillates at a frequency corresponding to an input control voltage, and
        a control voltage corrector that corrects the input control voltage to said master clock generator in accordance with the synchronization control information generated by said synchronization controller.

2. The base station synchronization system according to claim 1, wherein said synchronization controller is a higher-level device for said base stations.

3. The base station synchronization system according to claim 2, wherein said synchronization controller is a base station concentrator that relays between said plurality of base stations and a base station controller.

4. The base station synchronization system according to claim 2, wherein said synchronization controller is a base station controller that controls said plurality of base stations.

5. The base station synchronization system according to claim 1,
    wherein each base station from said plurality of base stations further includes:
        a phase information generator to generate phase information about a master clock oscillated by said master clock generator, and
        said control information generator of said synchronization controller generates the synchronization control information according to the phase information generated by said phase information generator.

6. The base station synchronization system according to claim 5,
    wherein said synchronization controller further includes:
        a clock generator to oscillate a clock at the first frequency, and
        a phase comparator to compare phase information about the clock oscillated by said clock generator with the phase information generated by said phase information generator of each base station from said plurality of base stations, and
        said control information generator of said synchronization controller generates the synchronization control information according to a result of phase comparison made by said phase comparator.

7. The base station synchronization system according to claim 6, wherein said phase comparator outputs an average among a plurality of results of the phase comparison.

8. The base station synchronization system according to claim 7, wherein said phase comparator is capable of setting an averaging cycle.

9. The base station synchronization system according to claim 5,
    wherein said synchronization controller further includes:
        a time information providing section to provide time information, and
        the phase information about the clock oscillated by said master clock generator of each base station from said plurality of base stations is corrected on a basis of the time information provided by said time information providing section of said synchronization controller.

10. The base station synchronization system according to claim 1,
wherein said synchronization controller further includes:
a clock generator to oscillate a clock at the first frequency, and
said control information generator of said synchronization controller generates the synchronization control information according to phase information about the clock oscillated by said clock generator.

11. The base station synchronization system according to claim 10,
wherein each base station from said plurality of base stations further includes:
a phase comparator to compare phase information about the clock oscillated by said master clock generator with phase information based on said synchronization control information, and
said control voltage corrector of each base station from said plurality of base stations corrects the input control voltage to said master clock generator in accordance with a result of the phase comparison made by said phase comparator.

12. The base station synchronization system according to claim 11, wherein said phase comparator outputs an average among a plurality of results of the phase comparison.

13. The base station synchronization system according to claim 12, wherein said phase comparator is capable of setting an averaging cycle.

14. The base station synchronization system according to claim 11,
wherein said synchronization controller further includes:
a time information providing section to provide time information, and
the phase information about the clock oscillated by said master clock generator of each base station from said plurality of base stations is corrected on a basis of the time information provided by said time information providing section of said synchronization controller.

15. The base station synchronization system according to claim 1, wherein the average difference is determined using an adjustable averaging period.

16. A synchronization controller that provides control to establish synchronization among a plurality of base stations, said synchronization controller comprising:
a control information generator to generate synchronization control information for synchronizing master clocks of said plurality of base stations with each other, the synchronization control information using an average difference between a count value corresponding to a first frequency associated with the synchronization controller and a count value corresponding to a second frequency associated with a base station from the plurality of base stations.

17. The synchronization controller according to claim 16, wherein the average difference is determined using an adjustable averaging period.

18. A base station that synchronizes with another base station, the base station comprising:
a master clock generator that oscillates at a frequency corresponding to an input control voltage; and
a control voltage corrector that corrects the input control voltage to said master clock generator in accordance with synchronization control information that is provided from a synchronization controller, the synchronization control information using an average difference between a count value corresponding to a first frequency associated with the synchronization controller and a count value corresponding to a second frequency associated with the base station.

19. The base station according to claim 18, wherein the average difference is determined using an adjustable averaging period.

* * * * *